United States Patent [19]

Chen

[11] Patent Number: 5,283,482
[45] Date of Patent: Feb. 1, 1994

[54] CMOS CIRCUIT FOR RECEIVING ECL SIGNALS

[75] Inventor: Dao-Long Chen, Fort Collins, Colo.
[73] Assignee: NCR Corporation, Dayton, Ohio
[21] Appl. No.: 909,266
[22] Filed: Jul. 6, 1992
[51] Int. Cl.$^5$ ............................... H03K 19/0175
[52] U.S. Cl. ............................. 307/475; 307/455; 307/296.8
[58] Field of Search ............ 307/475, 443, 455, 296.5, 307/296.8, 550, 554

[56] References Cited

U.S. PATENT DOCUMENTS

| | | | |
|---|---|---|---|
| 4,716,307 | 12/1987 | Aoyama | 307/296.8 |
| 4,841,175 | 6/1989 | De Man | 307/455 |
| 4,972,517 | 11/1990 | Kondou | 307/475 |
| 5,157,285 | 10/1992 | Allen | 307/296.8 |

Primary Examiner—Edward P. Westin
Assistant Examiner—Andrew Sanders
Attorney, Agent, or Firm—Richard C. Stevens

[57] ABSTRACT

A CMOS circuit for receiving ECL signals includes a triple-feedback arrangement for dynamically biasing a current source transistor of a differential amplifier of the CMOS circuit. The CMOS receiver circuit of the present application comprises a differential amplifier for generating an output signal representative of the difference between a reference signal and an ECL input signal and an inverter circuit for receiving the output signal and generating a CMOS compatible output signal. The differential amplifier includes a first current source transistor. A first CMOS transistor is connected to receive the ECL input signal and a second CMOS transistor is connected to receive the reference signal. The first and second CMOS transistors have their drains coupled to first and second load transistors, respectively, and their sources coupled to one another and to a second current source transistor for generating a first control signal representative of the difference between the ECL input signal and the reference signal at the drain of the first CMOS transistor. A first feedback path connects the first control signal to the second current source transistor. A second feedback path connects the first control signal to the first and second load transistors. A third feedback path connects the drain of the second CMOS transistor to the first current source transistor for dynamically biasing the first current source transistor.

20 Claims, 5 Drawing Sheets

| NET INPUT AMPLITUDE | TRIPLE - FEEDBACK DESIGN | CONVENTIONAL DESIGN |
|---|---|---|
| 300 mV | 1.3 ns | 2.3 ns |
| 100 mV | 2.4 ns | 3.4 ns |
| 50 mV | 3.3 ns | 4.2 ns |

FIG. 2A
MAX. ——— $V_{CC} - 0.88V$
LOGIC HIGH
MIN. ——— $V_{CC} - 1.03V$ —— 112
SWITCHING POINT ——— $V_{CC} - 1.33V$ —— 110
MAX. ——— $V_{CC} - 1.63V$ —— 114
LOGIC LOW
MIN. ——— $V_{CC} - 1.8V$
FIG. 2B
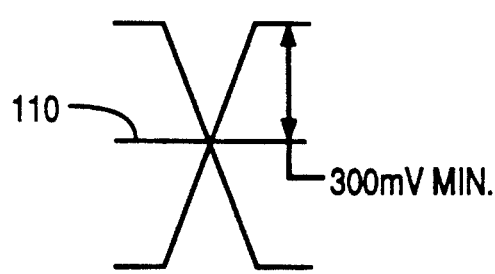
110 — 300mV MIN.
FIG. 2C
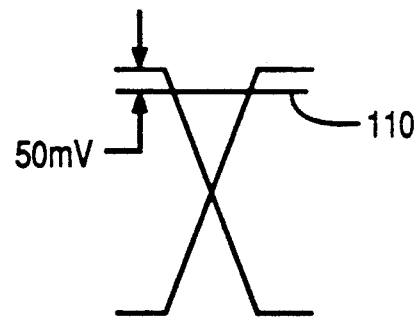
50mV — 110
FIG. 2D
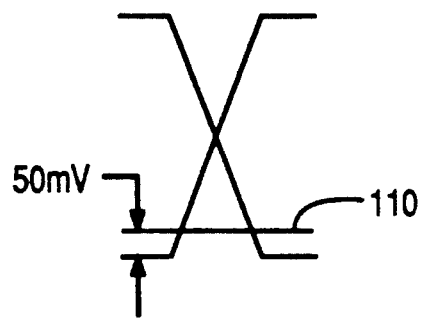
50mV — 110

CMOS CIRCUIT FOR RECEIVING ECL SIGNALS

BACKGROUND OF THE INVENTION

The present invention relates generally to signal converting or receiving circuits and, more particularly, to a CMOS (complementary metal-oxide-semiconductor) circuit for receiving ECL (emitter coupled logic) signals and converting them into CMOS signals for use in a related CMOS circuit.

Many current computer systems are implemented using more than one hardware technology in order to achieve better cost versus performance ratios. For example, it is not uncommon to find both CMOS and ECL circuits used in one computer system. CMOS circuits are typically used where cost, density and/or power consumption are important considerations since CMOS technology permits higher levels of integration, consumes less power and is less expensive. On the other hand, ECL circuits are used where high switching speeds are required.

A problem with implementing a computer system with more than one hardware technology, such as with CMOS and ECL, is that the same logic signal levels within the circuits are represented by different voltage levels. For example, in a CMOS circuit, a logic level "1" will commonly be represented by ground or zero potential and a corresponding logic level "0" will be represented by 5.0 V. In comparison, for an ECL circuit a logic level "1" may be represented by $-0.95$ V and a logic level "0" may be represented by $-1.72$ V. It is thus necessary to provide signal converters or receivers which interface signals from an ECL circuit to a CMOS circuit and vice versa.

Such signal receivers also contribute to higher operating speeds for CMOS circuits even where there are no ECL circuits used in a system. As the clock speeds of CMOS systems approach 100 MHz, many CMOS systems have adopted ECL logic levels at chip interfaces to reduce chip-to-chip crossing delays. By adopting ECL logic levels at the interfaces between CMOS chips, the voltage swings are much smaller and terminated transmission line networks provide shorter signal settling times. For example, many CMOS SRAMs (static random access memories) have been designed with ECL interfaces to achieve faster access times. In these and other similar cases, ECL signal receivers (ECL to CMOS) and CMOS signal receivers (CMOS to ECL) are needed even though an entire system is composed of CMOS circuits.

An example of a CMOS to ECL signal converter circuit or CMOS receiver circuit is illustrated in U.S. Pat. No. 5,047,671 which is assigned to the same assignee as the present application. A conventional prior art CMOS circuit 100 for receiving ECL signals, VIN, and converting the ECL signals to CMOS signals, VOUT, is illustrated in FIG. 1 and comprises a differential amplifier circuit 102 followed by an inverter circuit 104. Unfortunately, the conventional CMOS circuit 100 is highly susceptible to variations in the CMOS manufacturing process, operating temperature and voltage level of the power supply which variations lead to shifts in the transfer characteristics and resulting degradation in the sensitivity of the receiver. This sensitivity degradation substantially reduces the noise margin of the receiver since the voltage swings of the ECL logic levels are so small.

Accordingly, there is a need for an improved performance CMOS circuit for receiving ECL signals wherein the transfer characteristics are less susceptible to variations in the manufacturing process, operating temperature and power supply levels. Preferably, the improved performance CMOS circuit would include transfer characteristics which remain substantially symmetric around a logic level defining reference voltage.

SUMMARY OF THE INVENTION

This need is met by an improved CMOS circuit for receiving ECL signals in accordance with the present invention wherein a triple-feedback arrangement is provided to dynamically bias a current source transistor of a differential amplifier of the CMOS circuit.

In accordance with one aspect of the present invention, a CMOS circuit for receiving ECL signals comprises differential amplifier means for generating a differential output signal representative of the difference between a reference voltage input signal and an ECL input signal with the differential amplifier means including a current source transistor. Inverter means are coupled to the differential amplifier means for generating a CMOS output signal corresponding to the ECL input signal in response to the differential output signal. Bias means are provided to dynamically bias the current source transistor of the differential amplifier means in response to the reference voltage input signal and the ECL input signal. The dynamic bias of the current source of the differential amplifier means forms a first portion of the triple-feedback arrangement of the present invention.

The bias means may comprise bias differential amplifier means for generating a bias signal for dynamically biasing the current source transistor. Preferably, the bias differential amplifier means comprises a current source transistor and generates a feedback signal representative of the difference between the reference voltage input signal and the ECL input signal for dynamically biasing the current source transistor of the bias differential amplifier. This control of the current source transistor of the bias differential amplifier means forms a second portion of the triple-feedback arrangement of the present invention.

The bias differential amplifier further comprises load transistors and the feedback signal is further connected to control the load transistors within the bias differential amplifier. This control of the load transistors of the bias differential amplifier means forms a third portion of the triple-feedback arrangement of the present invention.

In accordance with another aspect of the present invention, a CMOS circuit for receiving ECL signals comprises first differential amplifier means for generating a differential output signal representative of the difference between a reference voltage input signal and an ECL input signal with the differential amplifier means including a current source transistor. Inverter means coupled to the first differential amplifier means provide for generating a CMOS output signal corresponding to the ECL input signal in response to the differential output signal. Second differential amplifier means generate a bias signal for dynamically biasing the current source transistor of the first differential amplifier means in response to the reference voltage input signal and the ECL input signal.

In accordance with this aspect of the present invention, the second differential amplifier means comprises a current source transistor and the second differential amplifier means further generates a feedback signal representative of the difference between the reference voltage input signal and the ECL input signal for dynamically biasing the current source transistor of the second differential amplifier means. The second differential amplifier means further comprises load transistors and the feedback signal is further connected to control the load transistors within the second differential amplifier means.

In accordance with still another aspect of the present invention, a CMOS circuit for receiving ECL signals comprises first differential amplifier means for generating a differential output signal representative of the difference between a reference voltage input signal and an ECL input signal, the first differential amplifier means including a current source transistor. Inverter means are coupled to the first differential amplifier means for generating a CMOS output signal corresponding to the ECL input signal in response to the differential output signal. Second differential amplifier means generate a dynamic bias signal to control the current source transistor of the first differential amplifier means in response to the reference voltage input signal and the ECL input signal with the second differential amplifier means comprising feedback means for controlling the dynamic bias signal.

In accordance with this aspect of the present invention, the second differential amplifier means further comprises a current source transistor and generates a first control signal representative of the difference between the reference voltage input signal and the ECL input signal. The feedback means comprises a first feedback path for connecting the first control signal to the current source transistor of the second differential amplifier means. Preferably, the second differential amplifier means further comprises load transistors and the feedback means further comprises a second feedback path for connecting the first control signal to the load transistors. A third feedback path provides for connecting the load transistor associated with the reference voltage input signal to the current source transistor of the first differential amplifier means for conduction of the dynamic bias signal.

In accordance with yet still another aspect of the present invention, a CMOS circuit for receiving ECL signals comprises differential amplifier means for generating a differential output signal representative of the difference between a reference voltage input signal and an ECL input signal, the differential amplifier means including a first current source transistor. Inverter means are coupled to the differential amplifier means for generating a CMOS output signal corresponding to the ECL input signal in response to the differential output signal. A first CMOS transistor having gate, drain and source, is connected to receive the ECL input signal on its gate. A second CMOS transistor having gate, drain and source is connected to receive the reference voltage input signal on its gate. The first and second CMOS transistors have their drains coupled to first and second load transistors, respectively, and have their sources coupled to one another and to a second current source transistor for generating a first control signal representative of the difference between the ECL input signal and the reference voltage input signal at the drain of the first CMOS transistor. A first feedback path connects the first control signal to the second current source transistor. A second feedback path connects the first control signal to the first and second load transistors. A third feedback path connects the drain of the second CMOS transistor to the first current source transistor for dynamically biasing the first current source transistor.

It is thus an object of the present invention to provide an improved CMOS circuit for receiving ECL signals which circuit is substantially faster and less sensitive to process, temperature and power supply variations than prior art receiving circuits; to provide an improved CMOS circuit for receiving ECL signals wherein a current source transistor of a differential amplifier of the circuit is dynamically biased; to provide an improved CMOS circuit for receiving ECL signals wherein a triple-feedback arrangement is used to dynamically bias a current source transistor of a differential amplifier of the circuit; and, to provide an improved CMOS circuit for receiving ECL signals which circuit only requires a limited number of transistors in addition to the transistors required for a conventional receiver circuit.

Other objects and advantages of the invention will be apparent from the following description, the accompanying drawings and the appended claims.

BRIEF DESCRIPTION OF THE DRAWING

FIGS. 2A–2D illustrate the narrow voltage ranges for valid ECL logic states;

DETAILED DESCRIPTION OF THE INVENTION

Figures 1, 3:
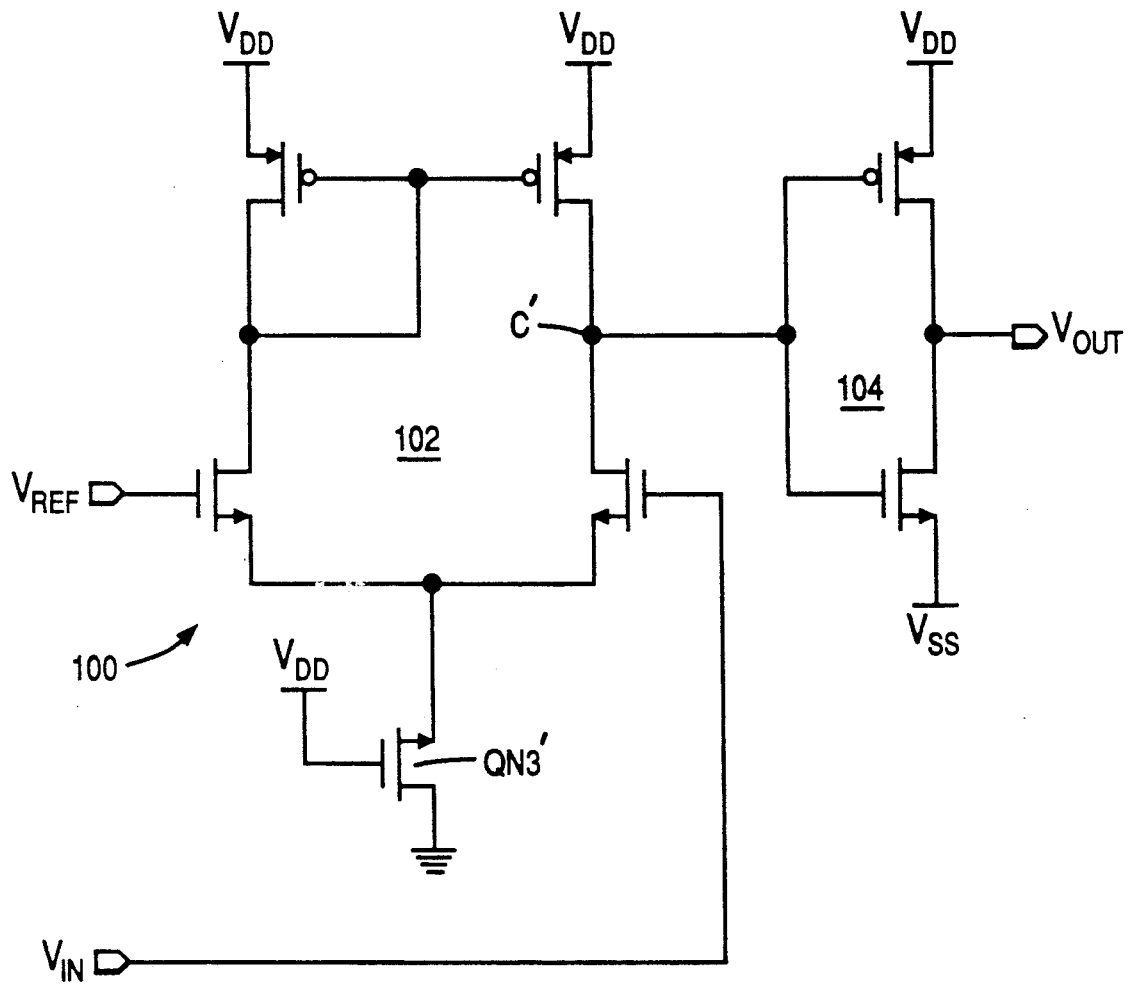
FIG. 1 is a schematic diagram of a conventional prior art CMOS circuit for receiving ECL signals.
FIG. 3 is a table comparing the prior art CMOS receiver circuit of FIG. 1 with the CMOS receiver circuit of the present invention.

A conventional prior art CMOS circuit 100 for receiving ECL signals, VIN, and converting the ECL signals to CMOS signals, VOUT, is illustrated in FIG. 1 and comprises a differential amplifier circuit 102 followed by an inverter circuit 104. Unfortunately, the conventional CMOS circuit 100 is highly susceptible to variations in the CMOS manufacturing process, operating temperature and voltage level of the power supply which variations lead to shifts in the transfer characteristics and resulting degradation in the sensitivity of the receiver. This sensitivity degradation substantially reduces the noise margin of the receiver since the voltage swings of the ECL logic levels are so small.

As shown in FIG. 2A, ECL logic signals have very narrow voltage ranges between valid logic states. The switching point 110 is at the center between a minimum logic high voltage 112 and a maximum logic low voltage 114. Ideally, the amplitude of a logic signal voltage level relative to the switching point 110 should be at least 300 mv, as shown in FIG. 2B. However, due to attenuation, noise coupling, and common-mode voltage shift, the actual amplitude or net amplitude of a logic signal voltage level available at the receiver can be much smaller than 300 mv, 50 mv as shown in FIG. 2C and 2D. The minimum net amplitude signal level required by a receiver to produce a specified output signal is called the sensitivity of the receiver. It is an important figure of merit for any ECL receiver design since the sensitivity determines the noise margin, i.e. the amount of noise which can be tolerated without error, of the design. In accordance with the present invention, an improved CMOS circuit for receiving ECL signals should provide a 50 mv worst-case sensitivity at a data rate of 300 Mbps (megabits-per-second).

Figure 4:
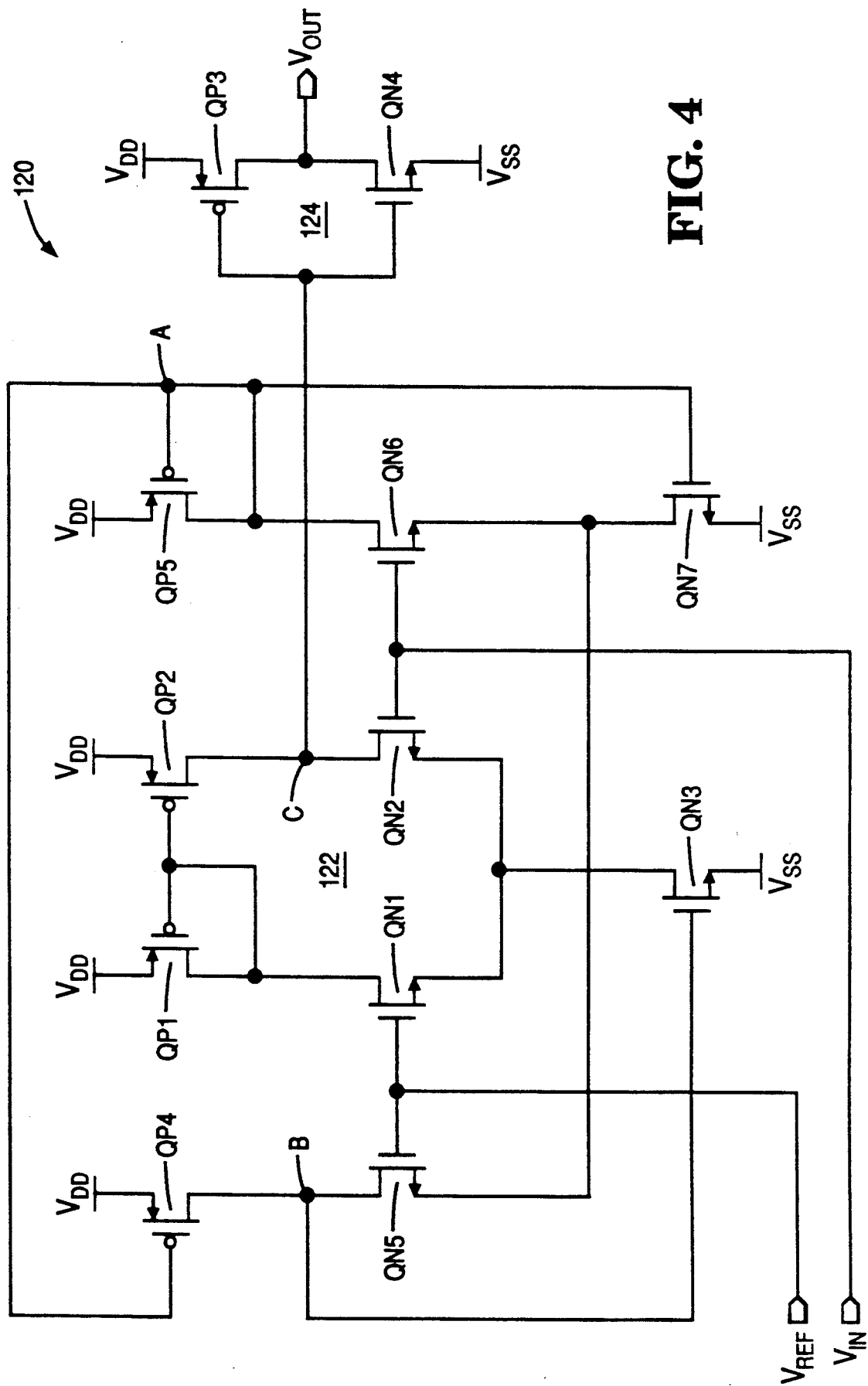
FIG. 4 is a schematic diagram of a CMOS circuit in accordance with the present invention for receiving ECL signals.

FIG. 4 is a schematic diagram of a CMOS circuit 120 in accordance with the present invention for receiving ECL signals. In a preferred embodiment, the CMOS circuit 120 or ECL receiver is fabricated on the same chip as a CMOS circuit for which it is receiving ECL signals. The CMOS circuit 120 is powered by the same power supply as the CMOS circuit for which it receives ECL signals, i.e. a positive voltage VDD which is approximately 0 V or ground potential and a negative voltage VSS which is approximately −5.0 V.

In the illustrated embodiment, the CMOS circuit 120 includes differential amplifier means comprising a first differential amplifier circuit 122 followed by inverter means comprising an inverter circuit 124 to invert and further amplify signals received from the first differential amplifier circuit 122. A reference voltage input signal, VREF, is set at the voltage level of the switching point 110 of FIGS. 2A-2D. An ECL input signal to be received and converted to a CMOS output signal is connected to the VIN input terminal.

The first differential amplifier circuit 122 comprises P channel transistors QP1, QP2 and N-channel transistors QN1, QN2, and QN3. The current-mirrored transistors QP1 and QP2 serve as an active load for the source-coupled pair QN1 and QN2. The transistor QN3 is a current source transistor for the first differential amplifier circuit 122 and, in accordance with the present invention, is dynamically biased at a voltage which is determined by the difference between the ECL input voltage VIN and the reference voltage input signal VREF. Dynamic or dynamically as used herein with reference to biasing the current source transistor QN3 of the differential amplifier circuit 122 of the CMOS circuit 120 refers to control of the biasing in response to received ECL signals. The inverter circuit 124 comprises a P-channel transistor QP3 and a N-channel transistor QN4.

Bias means for dynamically biasing the current source transistor QN3 comprises bias or second differential amplifier means for generating a dynamic bias signal which is connected to the current source transistor QN3. The bias or second differential amplifier means comprises a source-coupled pair of N-channel transistors QN5 and QN6 which are connected respectively to P-channel load transistors QP4 and QP5 and to an N-channel current source transistor QN7. The drain of the transistor QN6 is connected to the gates of the transistors QP4, QP5 and QN7 while the drain of the transistor QN5 is connected to the gate of the transistor QN3 to provide a triple-feedback arrangement for dynamically biasing the current source transistor QN3.

The voltage at node A, which is the output of the source-coupled pair of transistors QN5 and QN6, is fed back to the current source transistor QN7 and the load transistor QP4. This double-feedback biasing to the transistors QP4 and QN7 provides a high voltage gain at node B and a high degree of immunity to common-mode voltage shift at node A. Note that the voltage at node A is an inverted and slightly attenuated version of the voltage difference between VIN and VREF. This voltage tends to steer the current source transistor QN7 in a direction to compensate for any common-mode voltage shift at node A.

For example, if the transconductances of the P-channel transistors are below nominal values due to process variations, the common-mode voltage at node A will decrease since the IR drops across the load transistors QP4 and QP5 are higher than for nominal values. However, a lower voltage at node A will reduce the current that the current source transistor QN7 can supply. Accordingly, the IR drops across the transistors QP4 and QP5 will decrease and the common-mode voltage shift at node A will be significantly reduced.

While the common-mode voltage gain is reduced at node A, the differential voltage gain at node B is increased. For any increase in voltage at node A, the amount of current that the transistor QN7 can supply will also increase due to the feedback. As a result, the voltage drop across the load transistor QP4, which determines the voltage at node B, will also increase.

Finally, the voltage at node B is fed back to the current source transistor QN3 in the first differential amplifier circuit 122. The effect of this feedback to the current source transistor QN3 is similar to the feedback from node A to the transistor QN7. However, since the voltage gain at node B is much higher than the voltage gain at node A, the feedback effect is much stronger. As a result, there is a higher voltage gain at node C, which is the output of the first differential amplifier circuit 122.

For common-mode signals, the feedback from node B to the transistor QN3 behaves in very much the same way as the feedback from node A to the transistor QN7. Thus, any common-mode voltage shift at node B causes the current source transistor QN3 to react in the direction which will reduce the amount of common-mode shift at node C. The only difference is that the common-mode voltage gain at node B can be adjusted to minimize the common-mode voltage gain at node C. This arrangement provides more freedom in terms of choosing transistor sizes to optimize the performance of the first differential amplifier circuit 122.

Through the triple-feedback biasing arrangement, the voltage gain of the first differential amplifier circuit 122 is high enough to achieve a rail-to-rail swing at the output of the inverter circuit 124 with a worst case sensitivity of 50 mv. The advantages of the improved ECL receiver design of the present invention will now be highlighted by comparing the performance of the new triple-feedback CMOS ECL receiver of FIG. 4 with the conventional CMOS ECL receiver of FIG. 1.

In the conventional CMOS ECL receiver circuit 100 of FIG. 1, the bias of current source transistor QN3' in the differential amplifier 102 is fixed at VDD. For this comparison, the transistor sizes of the two receiver circuits of FIGS. 1 and 4 are chosen to be the same except for the current source transistor QN3'. To give a fair comparison, the size of the transistor QN3' is chosen so that the common-mode current in the conventional design of FIG. 1 is the same as the common-mode current in the triple-feedback design of the present invention as shown in FIG. 4.

Figure 5:
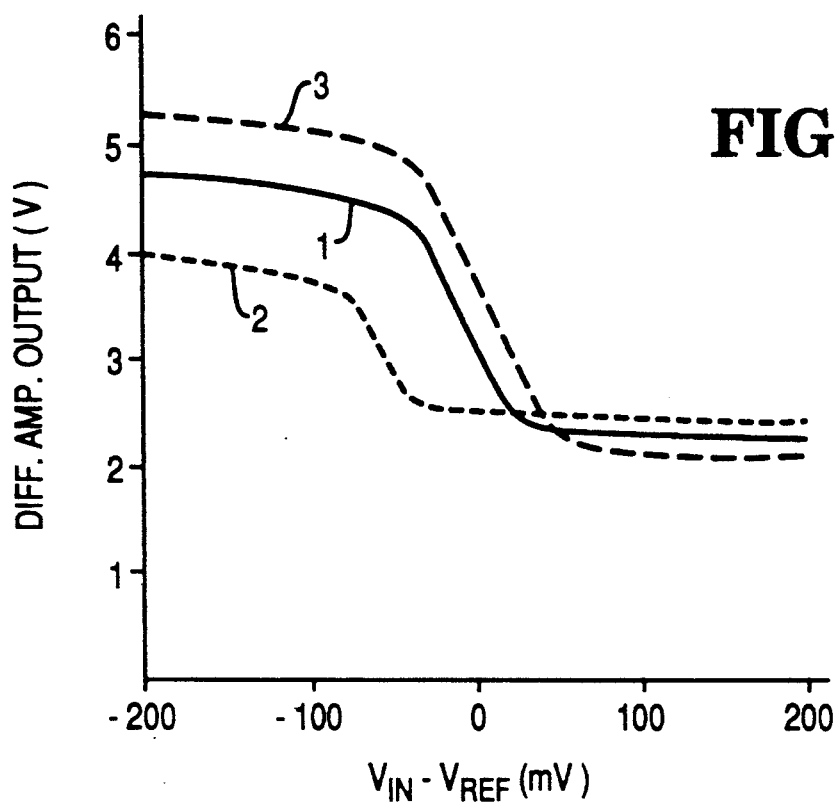
FIGS. 5 and 6 are graphs of operating voltages within the conventional prior art CMOS ECL receiver circuit of FIG. 1.

FIG. 5 shows the output voltage at node C' of the differential amplifier 102 in the conventional receiver design of FIG. 1 as a function of the voltage difference between VIN, the ECL signals to be received, and the reference voltage input signal, VREF. The results were computer simulated using transistor models having 0.7

μm effective channel lengths. Curve 1 is the nominal case which has an almost symmetrical transfer characteristic about the reference voltage input signal, VREF. However, when process, temperature, and power supply variations are taken into account, the curve is shifted either to the left or to the right. Curve 2 was simulated with fast N-channel transistors and slow P-channel transistors at 70° C. with a 4.5 V power supply. Curve 3 was simulated with slow N-channel transistors and fast P-channel transistors at 0° C. with a 5.5 V power supply.

Figure 6:
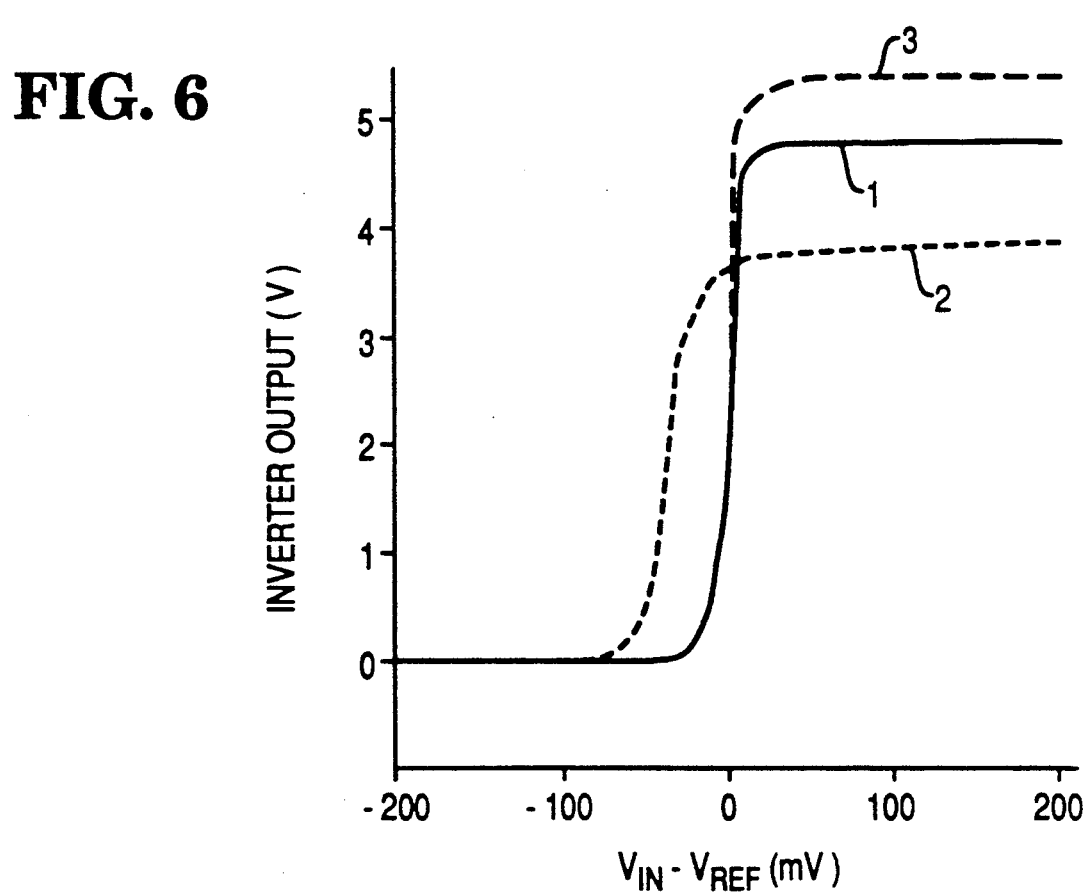

Any shift in the transfer characteristic will result in a degradation in the sensitivity of the receiver. The outputs of the inverter circuit 104 are shown in FIG. 6 for the same simulations. It is clear from FIG. 6 that a net input amplitude of more than 50 mv is required to achieve full-rail swing at the output of the inverter circuit 104 for worst-case conditions. This degradation in sensitivity substantially reduces the noise margin of the design since the voltage swings of the ECL logic levels are so small.

Figure 7:
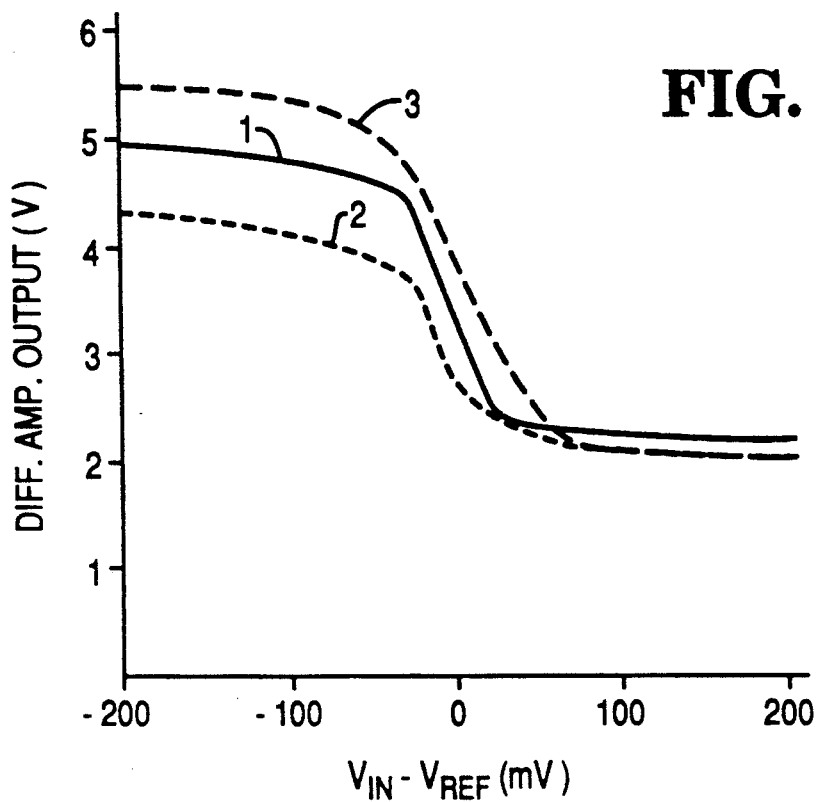
FIGS. 7 and 8 are graphs of operating voltages within the CMOS ECL receiver circuit of the present invention.
Figure 8:
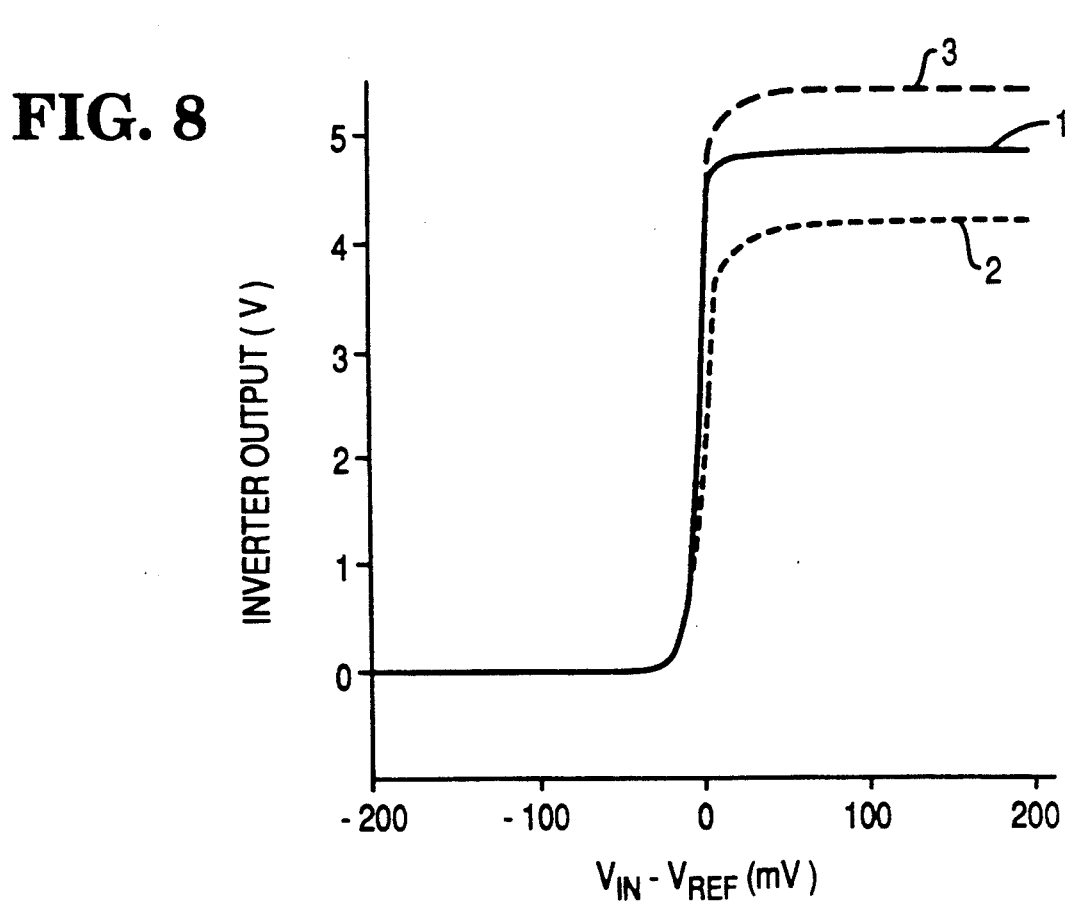

The CMOS circuit 120 of FIG. 4 has much better performance due to the triple-feedback biasing arrangement previously described. As shown in FIG. 7, the transfer characteristics of the CMOS circuit 120 of the present invention demonstrate substantially less shift in comparison to the prior art CMOS ECL receiver circuit 100 of FIG. 1. Moreover, most of the shift is vertical due to the supply voltage differences such that the transfer characteristics remain substantially symmetrical about the reference voltage input signal, VREF. The vertical shifts are compensated by the inverter circuit 124 since the supply voltage differences also apply to the inverter circuit 124. As a result, the output of the inverter circuit 124 is almost unaffected in terms of switching point or threshold, as clearly shown in FIG. 8. Consequently, the sensitivity of the triple-feedback ECL receiver of the present invention is substantially better than the conventional prior art design of FIG. 1.

Further, the speed of the ECL receiver of the present invention is also much better than the conventional design due to the feedback-enhanced voltage gain. FIG. 3 shows the minimum input pulse width that can pass through the CMOS circuit 120 of FIG. 4 in comparison to the minimum input pulse width that can pass through the receiver circuit 100 of FIG. 1 for given net signal amplitudes. The results shown in the table of FIG. 3 were simulated with fast N-channel transistors and slow P-channel transistors at 70° C. with a 4.5 V power supply which can be considered a worst-case condition.

As shown in FIG. 3, the CMOS circuit 120 is faster than the conventional prior art ECL receiver design at any signal amplitude level. At 300 mv, the receiver of the present invention is more than 1.7 times faster than the conventional receiver. Even with a net amplitude as low as 50 mv, the CMOS circuit 120 can still propagate pulses as narrow as 3.3 ns under worst-case conditions which is equivalent to a data rate of 300 Mbps (megabits-per-second) in NRZ format.

A review of the foregoing description reveals that an improved CMOS circuit for receiving ECL signals has been disclosed. This new CMOS ECL receiver design, CMOS circuit 120 of FIG. 4, includes a triple-feedback biasing arrangement and can handle lower input signal amplitude than the conventional prior art receiver design of FIG. 1. The new ECL receiver design of the present application can propagate data at higher speeds than the conventional prior art design and is less sensitive to process, temperature, and power supply variations. Of importance from an economic standpoint, the new ECL receiver design only requires five more transistors than the conventional prior art design and does not require external components for precision voltage or current biasing.

Having thus described the invention of the present application in detail and by reference to preferred embodiments thereof, it will be apparent that modifications and variations are possible without departing from the scope of the invention defined in the appended claims.

What is claimed is:

1. A CMOS circuit for receiving ECL signals comprising:
    differential amplifier means for generating a differential output signal representative of the difference between a reference voltage input signal and an ECL input signal, said differential amplifier means including a current source transistor;
    inverter means coupled to said differential amplifier means for generating a CMOS output signal corresponding to said ECL input signal in response to said differential output signal; and
    bias means receiving said reference voltage input signal and said ECL input signal as inputs for dynamically biasing said current source transistor of said differential amplifier means in response to said reference voltage input signal and said ECL input signal.

2. A CMOS circuit for receiving ECL signals as claimed in claim 1 wherein said bias means comprises bias differential amplifier means for generating a bias signal for dynamically biasing said current source transistor.

3. A CMOS circuit for receiving ECL signals as claimed in claim 2 wherein said bias differential amplifier means comprises a current source transistor and generates a feedback signal representative of the difference between said reference voltage input signal and said ECL input signal for dynamically biasing said current source transistor of said bias differential amplifier.

4. A CMOS circuit for receiving ECL signals as claimed in claim 3 wherein said bias differential amplifier further comprises load transistors and said feedback signal is further connected to control said load transistors within said bias differential amplifier.

5. A CMOS circuit for receiving ECL signals comprising:
    first differential amplifier means for generating a differential output signal representative of the difference between a reference voltage input signal and an ECL input signal, said differential amplifier means including a current source transistor;
    inverter means coupled to said first differential amplifier means for generating a CMOS output signal corresponding to said ECL input signal in response to said differential output signal; and
    second differential amplifier means receiving said reference voltage input signal and said ECL input signal as inputs for generating a bias signal for dynamically biasing said current source transistor of said first differential amplifier means in response to said reference voltage input signal and said ECL input signal.

6. A CMOS circuit for receiving ECL signals as claimed in claim 5 wherein said second differential amplifier means comprises a current source transistor and said second differential amplifier means further generates a feedback signal representative of the difference between said reference voltage input signal and said ECL input signal for dynamically biasing said current source transistor of said second differential amplifier means.

7. A CMOS circuit for receiving ECL signals as claimed in claim 6 wherein said second differential amplifier means further comprises load transistors and said feedback signal is further connected to control said load transistors within said second differential amplifier means.

8. A CMOS circuit for receiving ECL signals comprising:
first differential amplifier means for generating a differential output signal representative of the difference between a reference voltage input signal and an ECL input signal, said differential amplifier means including a current source transistor;
inverter means coupled to said first differential amplifier means for generating a CMOS output signal corresponding to said ECL input signal in response to said differential output signal; and
second differential amplifier means receiving said reference voltage input signal and said ECL input signal as inputs for generating a dynamic bias signal to control said current source transistor of said first differential amplifier means in response to said reference voltage input signal and said ECL input signal, said second differential amplifier means comprising feedback means for controlling said dynamic bias signal.

9. A CMOS circuit for receiving ECL signals as claimed in claim 8 wherein said second differential amplifier means further comprises a current source transistor and generates a first control signal representative of the difference between said reference voltage input signal and said ECL input signal, said feedback means comprising a first feedback path for connecting said first control signal to said current source transistor of said second differential amplifier means.

10. A CMOS circuit for receiving ECL signals as claimed in claim 9 wherein said second differential amplifier means further comprises load transistors and said feedback means further comprises a second feedback path for connecting said first control signal to said load transistors.

11. A CMOS circuit for receiving ECL signals as claimed in claim 10 wherein said feedback means further comprises a third feedback path for connecting the load transistor associated with said reference voltage signal to said current source transistor of said first differential amplifier means for conduction of said dynamic bias signal.

12. A CMOS circuit for receiving ECL signals comprising:
differential amplifier means for generating a differential output signal representative of the difference between a reference voltage input signal and an ECL input signal, said differential amplifier means including a first current source transistor;
inverter means coupled to said differential amplifier means for generating a CMOS output signal corresponding to said ECL input signal in response to said differential output signal;
a first CMOS transistor having gate, drain and source, said first CMOS transistor being connected to receive said ECL input signal on said gate thereof;
a second CMOS transistor having gate, drain and source, said second CMOS transistor being connected to receive said reference voltage input signal on said gate thereof,
said first and second CMOS transistors having their drains coupled to first and second load transistors, respectively, and having their sources coupled to one another and to a second current source transistor for generating a first control signal representative of the difference between said ECL input signal and said reference voltage input signal at the drain of said first CMOS transistor;
a first feedback path connecting said first control signal to said second current source transistor;
a second feedback path connecting said first control signal to said first and second load transistors; and
a third feedback path connecting said drain of said second CMOS transistor to said first current source transistor for dynamically biasing said first current source transistor.

13. A CMOS circuit for receiving ECL signals comprising:
differential amplifier means for generating a differential output signal representative of the difference between a reference voltage input signal and an ECL input signal, said differential amplifier including a current source transistor;
an inverter circuit coupled to said differential amplifier for generating a CMOS output signal corresponding to said ECL input signal in response to said differential output signal; and
a bias circuit coupled to said differential amplifier for receiving said reference voltage input signal and said ECL input signal as inputs to dynamically bias said current source transistor of said differential amplifier in response to said reference voltage input signal and said ECL input signal.

14. A CMOS circuit for receiving ECL signals as claimed in claim 13 wherein said bias circuit comprises a bias differential amplifier for generating a bias signal for dynamically biasing said current source transistor.

15. A CMOS circuit for receiving ECL signals as claimed in claim 14 wherein said bias differential amplifier comprises a current source transistor and generates a feedback signal representative of the difference between said reference voltage input signal and said ECL input signal for dynamically biasing said current source transistor of said bias differential amplifier.

16. A CMOS circuit for receiving ECL signals as claimed in claim 15 wherein said bias differential amplifier further comprises load transistors and said feedback signal is further connected to control said load transistors within said bias differential amplifier.

17. A CMOS circuit for receiving ECL signals comprising:
first differential amplifier means for generating a differential output signal representative of the difference between a reference voltage input signal and an ECL input signal, said differential amplifier means including a current source transistor;
an inverter circuit coupled to said first differential amplifier means for generating a CMOS output signal corresponding to said ECL input signal in response to said differential output signal; and
a second differential amplifier means receiving said reference voltage input signal and said ECL input signal as inputs for generating a dynamic bias signal to control said current source transistor of said first differential amplifier means in response to said reference voltage input signal and said ECL input signal.

18. A CMOS circuit for receiving ECL signals as claimed in claim 17 wherein said second differential amplifier comprises a current source transistor and generates a first control signal representative of the difference between said reference voltage input voltage and said ECL input signal, said CMOS circuit further comprising a first feedback path for connecting said first control signal to said current source transistor of said second differential amplifier.

19. A CMOS circuit for receiving ECL signals as claimed in claim 18 wherein said second differential amplifier further comprises load transistors and said CMOS circuit further comprises a second feedback path for connecting said first control signal to said load transistors.

20. A CMOS circuit for receiving ECL signals as claimed in claim 19 wherein said CMOS circuit further comprises a third feedback path for connecting the load transistor associated with said reference voltage signal to said current source transistor of said first differential amplifier for conduction of said dynamic bias signal.

* * * * *

UNITED STATES PATENT AND TRADEMARK OFFICE
CERTIFICATE OF CORRECTION

PATENT NO. : 5,283,482
DATED : February 1, 1994
INVENTOR(S) : Dao-Long Chen

It is certified that error appears in the above-indentified patent and that said Letters Patent is hereby corrected as shown below:

Column 9, Line 18, after "said", insert -- first--.

Column 10, Line 61, after "said", insert --first--.

Column 10, Line 62, delete "means".

Column 10, Line 64, delete "means".

Column 10, Line 67, after "amplifier", delete "means".

Column 11, Line 3, after "amplifier", delete "means".

Column 11, Line 12, after "input", delete "voltage" and insert --signal--.

Signed and Sealed this

Twenty-seventh Day of December, 1994

Attest:

BRUCE LEHMAN

*Attesting Officer*                *Commissioner of Patents and Trademarks*